United States Patent
Mooney et al.

(10) Patent No.: US 7,964,846 B2
(45) Date of Patent: Jun. 21, 2011

(54) RETRACTABLE LENS-COUPLED ELECTRON MICROSCOPE CAMERA WITH IMAGE SENSOR IN ELECTRON MICROSCOPE VACUUM CHAMBER

(75) Inventors: Paul Mooney, Pleasanton, CA (US); Daniel Moonen, Haarlem (NL)

(73) Assignee: Gatan, Inc., Warrendale, PA (US)

( * ) Notice: Subject to any disclaimer, the term of this patent is extended or adjusted under 35 U.S.C. 154(b) by 0 days.

(21) Appl. No.: 12/533,346

(22) Filed: Jul. 31, 2009

(65) Prior Publication Data

US 2010/0032576 A1    Feb. 11, 2010

Related U.S. Application Data

(60) Provisional application No. 61/085,808, filed on Aug. 1, 2008.

(51) Int. Cl.
*G01N 23/00* (2006.01)

(52) U.S. Cl. ........ 250/311; 250/306; 250/307; 250/310; 348/79; 348/80

(58) Field of Classification Search .............. 250/306, 250/307, 310, 311; 348/79, 80
See application file for complete search history.

(56) References Cited

U.S. PATENT DOCUMENTS

| | | | |
|---|---|---|---|
| 4,739,399 A * | 4/1988 | Swann et al. | 348/80 |
| 4,852,137 A | 7/1989 | Mackay | |
| 5,065,029 A | 11/1991 | Krivanek | |
| 5,401,964 A | 3/1995 | Mancuso | |
| 5,517,033 A * | 5/1996 | Krivanek et al. | 250/397 |
| 5,536,941 A | 7/1996 | Swann | |
| 6,061,085 A * | 5/2000 | Daberkow et al. | 348/80 |

FOREIGN PATENT DOCUMENTS

JP    H08-264148    10/1996

* cited by examiner

*Primary Examiner* — Robert Kim
*Assistant Examiner* — Michael Maskell
(74) *Attorney, Agent, or Firm* — Caesar, Rivise, Bernstein, Cohen & Pokotilow, Ltd.

(57) ABSTRACT

A lens-coupled camera for an electron microscope is disclosed. The camera includes a CCD, a scintillator, at least one lens, and a mirror, such that at least the CCD and scintillator are housed in the vacuum chamber of the electron microscope, which has only one vacuum chamber. In a further embodiment, the CCD, scintillator, lens and mirror are affixed to a fixed mechanical linkage such that the CCD, scintillator, lens and mirror move together when the camera is retracted.

13 Claims, 1 Drawing Sheet

RETRACTABLE LENS-COUPLED ELECTRON MICROSCOPE CAMERA WITH IMAGE SENSOR IN ELECTRON MICROSCOPE VACUUM CHAMBER

CROSS-REFERENCE TO RELATED APPLICATIONS

This utility application claims the benefit under 35 U.S.C. §119(e) of Provisional Application Ser. No. 61/085,808 filed on Aug. 1, 2008 and entitled Retractable Lens-coupled Electron Microscope with Image Sensor in Electron Microscope Vacuum Chamber, the entire disclosure of which is incorporated by reference herein.

FIELD OF THE INVENTION

This invention relates generally to electron microscopy and more particularly to placement of image sensors for electron microscopy.

BACKGROUND OF THE INVENTION

In a lens-coupled electron microscope camera, when the image sensor is not in the microscope vacuum, it is necessary to have two optically-transmitting vacuum walls (windows), one to contain the image sensor so that it can be cooled without accumulating condensation from the atmosphere and one to act as a continuation of the vacuum wall of the microscope to maintain integrity of the electron microscope vacuum system and x-ray safety shielding while still transmitting light with minimal deflection and scattering so that an image of the electron-illuminated scintillator can be formed outside the microscope vacuum.

The presence of these two extra layers of glass, which do not in general contribute to the action of the lens, and the fact that the inner one must address the need for sufficient mass thickness to block x-rays produced in the microscope, especially at the scintillator and supporting structures, and the four extra reflective surfaces added by these two glass elements, together have one or more of the following consequences: (1) They reduce the sharpness of the image formed at the sensor. (2) They incur the need for custom optical design in the lens for the purpose of compensating those aberrations. (3) They increase the light absorption and thereby reduce the sensitivity of the system. (4) They increase the problem of scatter and ghost images due to reflections at the 4 additional optical surfaces. (5) They increase the object-to-image distance of the optical system thereby limiting the maximum collection angle possible with a given lens diameter and consequently limit the sensitivity of the lens unless the lens-element diameter is increased proportionally, with associated difficulties with the mechanical interface to the microscope. (6) Finally, the additional elements increase the cost of the system, both directly and by the cost of the measures needed to compensate their defects when it is necessary to do so.

One possible mitigation of the added-window problem is to integrate the vacuum windows into the design of the lens, making the first lens-element the microscope vacuum window and the last, the image sensor vacuum window. However, this approach leads to other problems since it mixes the mechanical constraints, forces and x-ray shielding needs of the microscope vacuum barrier with the delicate constraints of realizing the imaging optics.

When the image sensor is mounted outside the microscope vacuum in a retractable camera, it becomes difficult to provide for correct focal alignment during operation. It is necessary to provide a mechanical linkage independent of the optical chain itself which either runs in parallel to the optical chain or surrounds it. This linkage must provide consistent alignment over repeated insertions and retractions of the optical system in the presence of the forces generated by air pressure outside the microscope vacuum on the movable optical system. One approach has been to place the mechanical linkage from image sensor to scintillator to the sides of the optical system with small cross-sectional area to minimize air-vacuum barrier forces and leave the microscope vacuum window fixed.

Thus there remains a need for a method of housing a scintillator, lens and image sensor for an electron microscope which simultaneously provides high-quality and high-sensitivity optical coupling, and alignment stability during insertion and retraction.

The following references are relevant to the background of the invention and are incorporated herein by reference. U.S. Pat. No. 5,065,029, Cooled CCD Camera for an Electron Microscope; U.S. Pat. No. 5,536,941, Rotatable Wide-Angle Camera and Prism Assembly for Electron Microscopes; U.S. Pat. No. 6,061,085, Camera System for a Transmission Electron Microscope, and Japanese Unexamined Patent Application H08-264148 by Tokuichiro Hayashi, filed Mar. 23, 2005.

SUMMARY OF THE INVENTION

In an embodiment, the invention comprises a lens-coupled camera for an electron microscope. The camera includes a CCD, a scintillator, at least one lens, and a mirror, such that at least the CCD and scintillator are housed in the vacuum chamber of the electron microscope, which has only one vacuum chamber.

In a further embodiment, the CCD, scintillator, lens and mirror are affixed to a fixed mechanical linkage such that the CCD, scintillator, lens and mirror move together when the camera is retracted.

DESCRIPTION OF THE PREFERRED EMBODIMENT OF THE INVENTION

Figure 1:
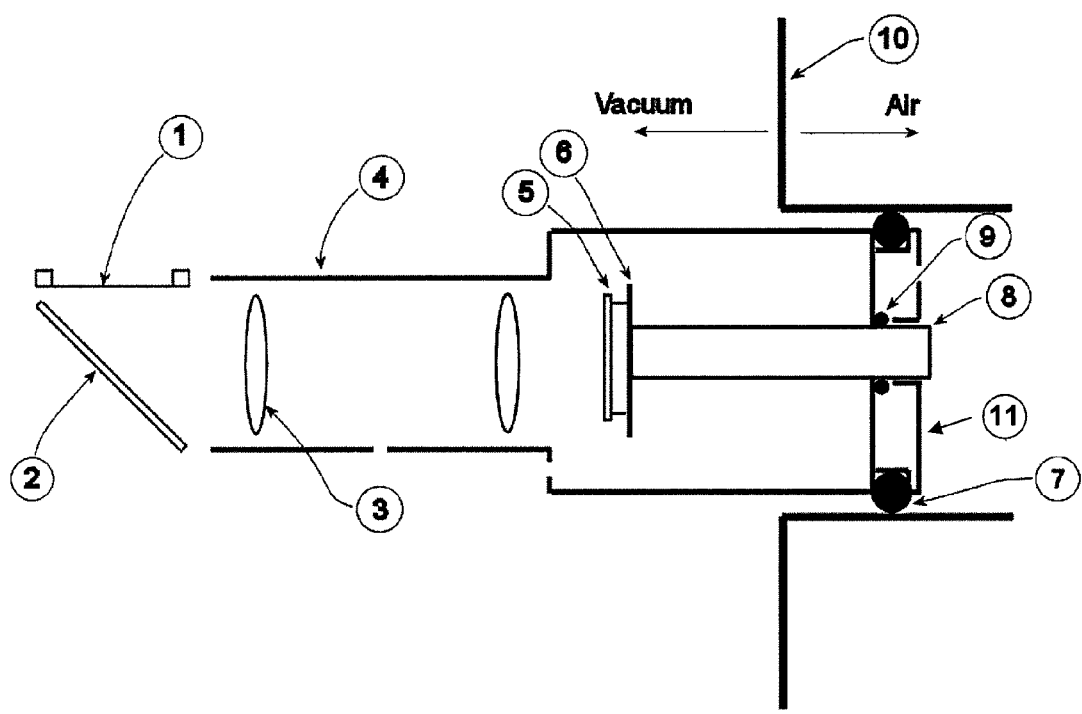
FIG. 1. is a block diagram of an embodiment of and optics system for an electron microscope, according to an aspect of the invention.

In a preferred embodiment of the invention, the two vacuum barriers are removed and the image sensor is placed into the microscope vacuum. This provides for significant mitigation of the problems and challenges introduced by the CCD-out-of-vacuum solution in the prior art. Removal of two glass elements in the optical path allows simplification with consequent increase in performance or reduction in complexity/cost—or a combination of the two. Few interfaces means fewer reflections. Less in-glass optical path length means shorter objective to image distance with opportunity for higher numerical aperture. It also leads to reduced optical aberrations.

When the image sensor is in the electron microscope vacuum, it also allows alignment and focus of the sensor relative to the lens and scintillator to be realized more simply since the mechanical linkage between these elements does not have to traverse a vacuum wall. In this way, the part of the camera which inserts into the electron microscope can be made more compact.

Referring the FIG. 1, a retractable electron microscope camera incorporating an embodiment of the invention is shown, including a scintillator 1, a mirror or prism 2, light optics/lenses 3, which image the scintillator onto the imaging device, a camera enclosure 4, which firmly links items 1, 2, 3, 5 and 6. The camera enclosure 4 seals the Transmission Electron Microscope (TEM) vacuum by means of a sliding o-ring seal or flexible bellows (not shown). The camera enclosure 4 can be inserted and retracted. The inside of the camera enclosure 4 is open to the electron microscope vacuum. Vent holes (not shown) and the like provide adequate openings so all components inside the camera enclosure 4 are fully in the electron microscope vacuum. The retractable camera further includes an imaging device 5, which may be one of the following: CCD, interline CCD, or a CMOS imager; an electronics board 6 for mounting the imager 5, which provides a means of bringing the signal from the imaging device 5 outside the vacuum, and which applies the electrical signals needed to operate the imaging device 5; a sliding O-ring seal 7 (a sliding vacuum seal may also be constructed using welded bellows or any other means); a mechanism 8 for adjusting the position of the imaging device 5 to obtain good focus of the image from the scintillator 1. Not shown here: one or more parts of the optics may be made adjustable to focus the camera. The scintillator 1 may be made adjustable to focus the camera. The mirror 2 may be made adjustable to focus the camera. Also shown in FIG. 1 is a vacuum seal 9 between the adjustment mechanism 8 and the camera enclosure 4. The vacuum seal 9 can be made with an O-ring or with bellows. The camera is shown mounted in an electron microscope vacuum wall 10.

In an embodiment, reference items 1 through 6, 8, 9, move together with fixed relative positions when the camera is inserted or retracted. The retraction mechanism is not shown. The image sensor is located in the same vacuum chamber as the electron microscope. In a further embodiment, the sliding O-ring seal also moves together with items 1-6, 8 and 9.

Adjustment of the imaging device 5, lenses 3, mirror 2 or scintillator 1 to focus the camera may also be done by means of motors placed inside the vacuum. In a alternate embodiment, the camera is constructed without a focus mechanism. In a further embodiment, the camera is constructed with a focus mechanism that can only be adjusted before the camera is attached to the electron microscope. In this implementation, which includes a focus mechanism, the cross-sectional diameter of the focus adjustment rod 8, is kept small to minimize affect of air/vacuum barrier forces.

The main body 4 of the camera, can be seen to be free of stresses caused by the air/vacuum interface. Only the very short path of the thick back flange 11 of the camera bears air/vacuum stresses.

While certain representative embodiments and details have been shown for purposes of illustrating the invention, it will be apparent to those skilled in the art that various changes in the methods and apparatus disclosed herein many be made without departing from the scope of the invention.

We claim:

1. A lens-coupled camera for an electron microscope, the microscope having a cylindrical vacuum chamber with an axis parallel to an electron beam path, the camera comprising:

a hollow camera enclosure mounted to the cylindrical chamber and having an interior in vacuum communication with the cylindrical vacuum chamber;
an image sensor housed within said hollow camera enclosure and outside the cylindrical vacuum chamber and
a scintillator located within said cylindrical vacuum chamber;
wherein said image sensor and scintillator are in vacuum communication with said cylindrical chamber and wherein said image sensor is selected from the group consisting of a CCD and a CMOS image sensor.

2. The lens-coupled camera of claim 1, further comprising a lens,
a mirror, and
a mechanical linkage, wherein
said image sensor, scintillator, lens and mirror are affixed to said fixed mechanical linkage such that said image sensor, scintillator, lens and mirror move together when the camera is retracted.

3. The lens-coupled camera of claim 2 in which said mechanical linkage does not bear any forces of the vacuum/air barrier.

4. The lens-coupled camera of claim 1 further comprising; x-ray shielding comprised of an opaque material which surrounds the lens-coupled camera.

5. The lens-coupled camera of claim 2 wherein said lens is located at least partially inside an access port of the electron microscope.

6. The lens-coupled camera of claim 2 further comprising a focusing mechanism, wherein said focusing mechanism is adapted to move said image sensor relative to said lens.

7. The lens-coupled camera of claim 6 in which said focusing mechanism traverses the air/vacuum barrier of the electron microscope through a small-diameter port to minimize air pressure forces on image sensor alignment.

8. The lens-coupled camera of claim 6 in which said focusing mechanism comprises a motor positioned inside the same vacuum chamber.

9. The lens-coupled camera of claim 1 comprising lens elements that are focused in a fixed configuration upon initial construction without need for further adjustment after mounting on the electron microscope.

10. The lens-coupled camera of claim 1 wherein said scintillator is mounted to be adjustable for focusing.

11. The lens-coupled camera of claim 2 wherein said mirror is mounted to be adjustable for focusing.

12. The lens-coupled camera of claim 1, comprising one or more lens elements and in which focusing is accomplished through movement of one or more of said lens elements.

13. A method for manufacturing a lens-coupled camera for an electron microscope, the microscope having a cylindrical vacuum chamber with an axis parallel to an electron beam path, the camera comprising a hollow camera enclosure mounted to the cylindrical chamber and having an interior in vacuum communication with the cylindrical vacuum chamber, an image sensor housed within said hollow camera enclosure,
a scintillator located within said cylindrical vacuum chamber and a focusing mechanism adapted to move said image sensor relative to said lens, said scintillator and image sensor in vacuum communication with the cylindrical vacuum chamber, the method comprising
adjusting the focusing mechanism prior to mounting on the electron microscope.

* * * * *